US008804421B2

(12) United States Patent
Motwani

(10) Patent No.: US 8,804,421 B2
(45) Date of Patent: Aug. 12, 2014

(54) CENTER READ REFERENCE VOLTAGE DETERMINATION BASED ON ESTIMATED PROBABILITY DENSITY FUNCTION

(71) Applicant: Ravi H. Motwani, San Diego, CA (US)

(72) Inventor: Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 13/664,807

(22) Filed: Oct. 31, 2012

(65) Prior Publication Data

US 2014/0119114 A1    May 1, 2014

(51) Int. Cl.
*G11C 16/04*    (2006.01)
*G11C 16/26*    (2006.01)

(52) U.S. Cl.
CPC ..................................... *G11C 16/26* (2013.01)
USPC ................................. 365/185.03; 365/185.09

(58) Field of Classification Search
CPC ........................................................ G11C 16/26
USPC ........................... 365/185.03, 185.09, 185.18
See application file for complete search history.

(56) References Cited

U.S. PATENT DOCUMENTS

| | | |
|---|---|---|
| 8,000,135 B1 | 8/2011 | Perlmutter et al. |
| 2008/0244360 A1* | 10/2008 | Mokhlesi et al. ............. 714/758 |
| 2010/0091535 A1 | 4/2010 | Sommer et al. |
| 2010/0262414 A1 | 10/2010 | Joshi et al. |
| 2011/0051521 A1 | 3/2011 | Levy et al. |
| 2011/0216590 A1 | 9/2011 | Eun et al. |

OTHER PUBLICATIONS

International Search Report and Written Opinion for PCT/US2013/046754, mailed Oct. 7, 2013, 12 pages.

* cited by examiner

*Primary Examiner* — Vu Le
(74) *Attorney, Agent, or Firm* — Schwabe, Williamson & Wyatt, P.C.

(57) ABSTRACT

Embodiments include systems, methods, and apparatuses to estimate respective first and second cumulative density functions (CDFs) for values of a plurality of non-volatile memory (NVM) cells in a page of memory. The CDFs may be based at least in part on one or more decoder outputs of codewords for data stored in the page. Based at least in part on the CDFs, first and second probability density functions (PDFs) may be estimated for the values of the page of memory. A center read reference voltage may then be determined for reading a cell in the page. The center read reference voltage may be based at least in part on the first and second PDFs.

24 Claims, 6 Drawing Sheets

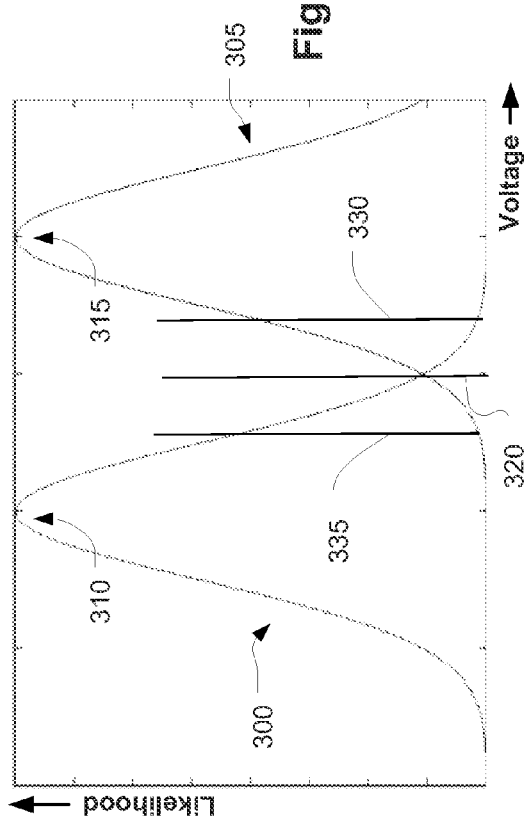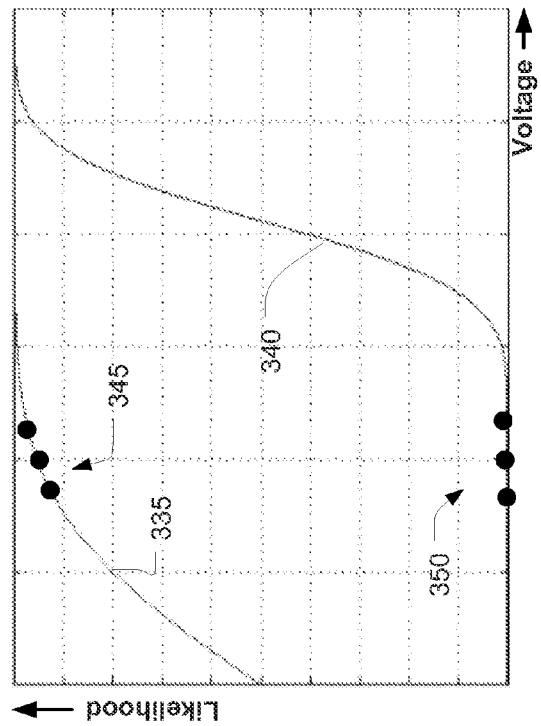

CENTER READ REFERENCE VOLTAGE DETERMINATION BASED ON ESTIMATED PROBABILITY DENSITY FUNCTION

FIELD

Embodiments of the present invention relate generally to the technical field of non-volatile memory (NVM). Specific embodiments describe methods of reading values stored by the NVM.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

NVM, for example NAND-type Flash in a solid state drive (SSD), often stores low density parity check (LDPC) encoded data. The data may be stored in multi-bit cells organized into pages of the memory. The data may be retrieved according to either a hard read or a soft read as long as the center read reference voltage used to read the data from the cells in the page is correctly positioned. If the center read reference voltage is not correctly positioned, then the raw bit error rate (RBER) may increase and this can lead to LDPC decoding failure. This decoding failure may be especially prevalent for hard data reads. Additionally, if the read reference voltage is not correctly chosen, then confidence information provided by soft bit reads may not be optimized.

To overcome this problem, prior solutions have proposed a moving read reference (MRR) which consists of moving the center read reference on an ad-hoc basis. Specifically, prior solutions have read data from the NVM using hard bit reads, and then used algebraic error correcting codes like Bose-Chaudhuri-Hocquenghem (BCH) codes to attempt to reposition the center read reference voltage. However, the use of BCH codes may not be desirable in certain circumstances. Additionally, the use of BCH codes may preclude the ability to use soft bit reads and obtain confidence data for one or more cell values.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 3-A illustrates exemplary PDFs for values of a single-bit solid state memory cell, in accordance with various embodiments.

FIG. 3-B illustrates exemplary cumulative density functions (CDFs) for values of a single-bit solid state memory cell, in accordance with various embodiments.

DETAILED DESCRIPTION

Figure 1:
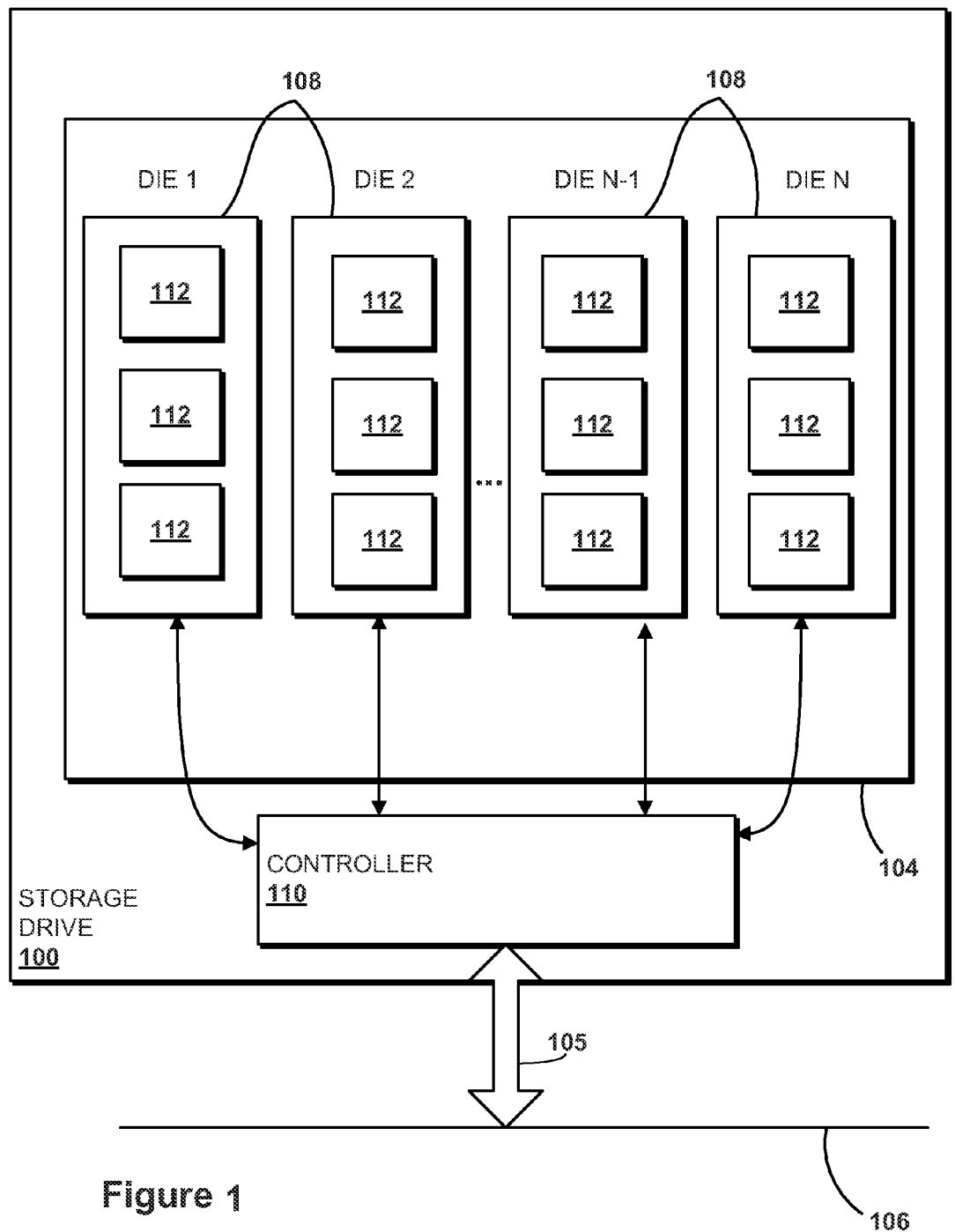
FIG. 1 illustrates an exemplary storage drive storing data in die of NVM, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Apparatuses, methods, and storage media associated with multi-bit NVM are disclosed herein. In embodiments, either a hard bit read (HBR) comprising a single read of a memory cell, or a soft bit read (SBR) comprising a plurality of reads of a memory cell, may be performed, for example by a controller. Specifically, an HBR or an SBR of the values of a plurality of memory cells in a page of the NVM may be performed to produce estimated values of the cells. Generally, data may be stored in multiple die of the NVM. Each die may have a plurality of pages, and each page may contain a plurality of multi-bit memory cells. One or more codewords may be decoded, and erroneous estimated values of the cells may be corrected based at least in part on the codewords. Based at least partially on the corrected values, a plurality of CDFs may be calculated for the page. PDFs may then be estimated for the page of the NVM, based at least in part on the CDFs. Based on the PDFs, a new center read reference voltage may be calculated to read the voltage of a cell in the page of the NVM.

In embodiments, the new center read reference voltage may be the voltage with a relatively low RBER. Additionally, the codeword may be an LDPC codeword. In some embodiments, the new center read reference voltage may be calculated for reading the most significant bits (MSBs) of the multi-bit cells in the memory page. In other embodiments, the center read reference voltage may be calculated for reading the least significant bits (LSBs) of the multi-bit cells in the page of NVM. In some embodiments, the new center read reference voltage calculated to read the LSBs of the multi-bit cells in the memory page may be based at least in part on data obtained while calculating a new center read reference voltage for the MSBs of the multi-bit cells in the page of NVM.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

With reference to FIG. 1, in various embodiments, a storage drive 100, may include NVM 104. Data may be written to and/or read from NVM 104 by a controller 110, e.g., by way of one or more communication lines 106 (e.g., one or more buses such as a Serial ATA, or SATA bus). The read or write processes may be respectively performed by a "reader" or "writer" which may be separate from one another, or combined. In some embodiments the reader or writer may be part of the controller 110, or they may be physically separate from, but communicatively coupled with, controller 110. In some embodiments, the reader and the writer may be implemented as hardware, firmware, software, or some combination thereof.

Although not depicted, various other components may be coupled with storage drive 100 via one or more communication lines 106, including but not limited to one or more central processing units (CPUs), volatile memory (e.g., dynamic random access memory, or DRAM), one or more input/output (I/O) devices, alternative processing units (e.g., graphics processors), and so forth. In various embodiments, storage drive 100 may be a solid state drive (SSD) or hybrid hard drive (HHD).

NVM 104 may come in various forms, including but not limited to NAND (flash) memory, ferroelectric random-access memory (FeTRAM), nanowire-based non-volatile memory, phase change memory (PCM), PCM with switch (PCMS), memory that incorporates memristor technology, MRAM, STT-MRAM, and so forth. In many cases, including the example of FIG. 1, NVM 104 may include a plurality of die 108. For example, in FIG. 1, NVM 104 includes N die 108. N may be any positive integer. In other embodiments, NVM 104 may only include a single die 108. As shown in FIG. 1, each die 108 may have one or more pages 112 of memory, as will be explained in greater detail below. It will be understood that although 3 pages 112 are shown per die 108, each die may have more or less pages 112. Additionally, each die 108 does not necessarily have to have the same amount of pages as another die 108. Finally, the data may be arranged in different groupings as described herein, for example as blocks of memory.

Commonly, information may be stored in an NVM 104 in a plurality of cells (not shown). In certain embodiments, the cells may store only a single bit. For example, some or all of the cells may only store a value of "1" or "0". In other embodiments, some or all of the cells may be multi-bit, and may be configured to store values such as "00", "01", "10" or "11". Other embodiments may have cells that store additional bits and/or values. In multi-bit embodiments, the first value of the cell may be considered the MSB, and the last value of the cell may be considered the LSB. For example, if the cell is storing the value "10", then the MSB may be "1" and the LSB may be "0". Reading the LSBs of cells in the plurality of cells may be called an upper page read, while reading the MSBs of cells in the plurality of cells may be called a lower page read.

Together, the cells may store information that is measured on a scale from bits to gigabytes of information, dependent on the NVM 104. In certain embodiments, the cells may store even more information. The NVM 104 may contain data stored on one or more die 108. Each die 108 may contain a page 112 of memory, and each page 112 of memory may be comprised of a plurality of cells. In certain embodiments, the data may be further subdivided such that the pages 112 of memory are arranged into "blocks" (not shown). As an example, one embodiment of a die 108 may comprise 2048 blocks of memory, and each block of memory may comprise 256 pages 112 of memory. Each page 112 of memory may hold 16 KB of data stored in a plurality of multi-bit memory cells. It will be recognized, however, that a die 108 may be divided into different increments, and the number of blocks, pages, or data per page may each be greater or smaller in different embodiments.

In various embodiments, error correcting codes may be used with original data stored in NVM 104 to protect the original data from raw bit errors. For example, the data may be encoded, e.g., by controller 110, into a "codeword." Various encoding schemes may be employed. For example, in various embodiments, concatenated coding, turbo coding, and/or LDPC coding may be employed. In various embodiments, controller 110 may be any combination of hardware and software, and may be separate from storage drive 100, e.g., as an independent component, e.g., on a printed circuit board ("PCB," not shown). For example, if the page of memory is configured to store 16 KB of data, the 16 KB of data may be encoded as 16 1 KB codewords. When the values of the cells are read from the NVM 104, the LDPC codewords can be decoded to calculate whether the values of the cells are being read correctly. If the cells are read incorrectly, the LDPC codewords may be used to correct the values of the incorrect cells.

In various embodiments, a codeword may include the original data plus parity data appended to the end. However, the form of the codeword is not material, and in other embodiments, codewords may take other forms. In general, the larger the codeword, the higher resilience NVM 104 may have to bit errors.

In various embodiments, controller 110 may be configured to decode the codeword, e.g., after the codeword is read from NVM 104. Various types of decoding schemes may be employed by controller 110 including but not limited to iterative decoding schemes such as LDPC, concatenated schemes, turbo codes, and so forth. Many such decoding schemes may be capable of detecting and correcting at least some errors.

Typically, a value in an NVM cell may be read by applying a center read reference voltage to the cell. By applying the center read reference voltage, the value of the cell can be determined based on whether the cell is storing a value at a voltage which is higher or lower than the center read reference voltage. For example, a single-bit cell may be configured such that the cell is storing a value of "1" if the voltage of the cell is set at a relatively low voltage, and the cell is storing a value of "0" if the voltage of the cell is set at a relatively high voltage. In this embodiment, a center read reference voltage between the relatively low voltage and the relatively high voltage may be used to determine the value of the cell.

If only a single center read reference voltage is applied, then the cell may yield a "hard" decision regarding the value held by the cell, and reading the values of the cell may be considered an HBR. If multiple read reference voltages, including a center read reference voltage, are applied, then the cell may yield a "soft" decision regarding the value held by the cell, and reading the value of the cell may be considered an SBR. The soft decision may provide information regarding the value of the cell, and additionally it may provide information regarding the confidence level of the cell's value being read correctly. In some instances, the confidence level may be high, which indicates a high probability that the value output by reading the cell is correct. In other instances, the confidence level may be low, which indicates a low probability that the value output by reading the cell is correct. Further embodiments and examples of HBR and SBR are discussed below with reference to FIG. 3-A.

Figure 2:
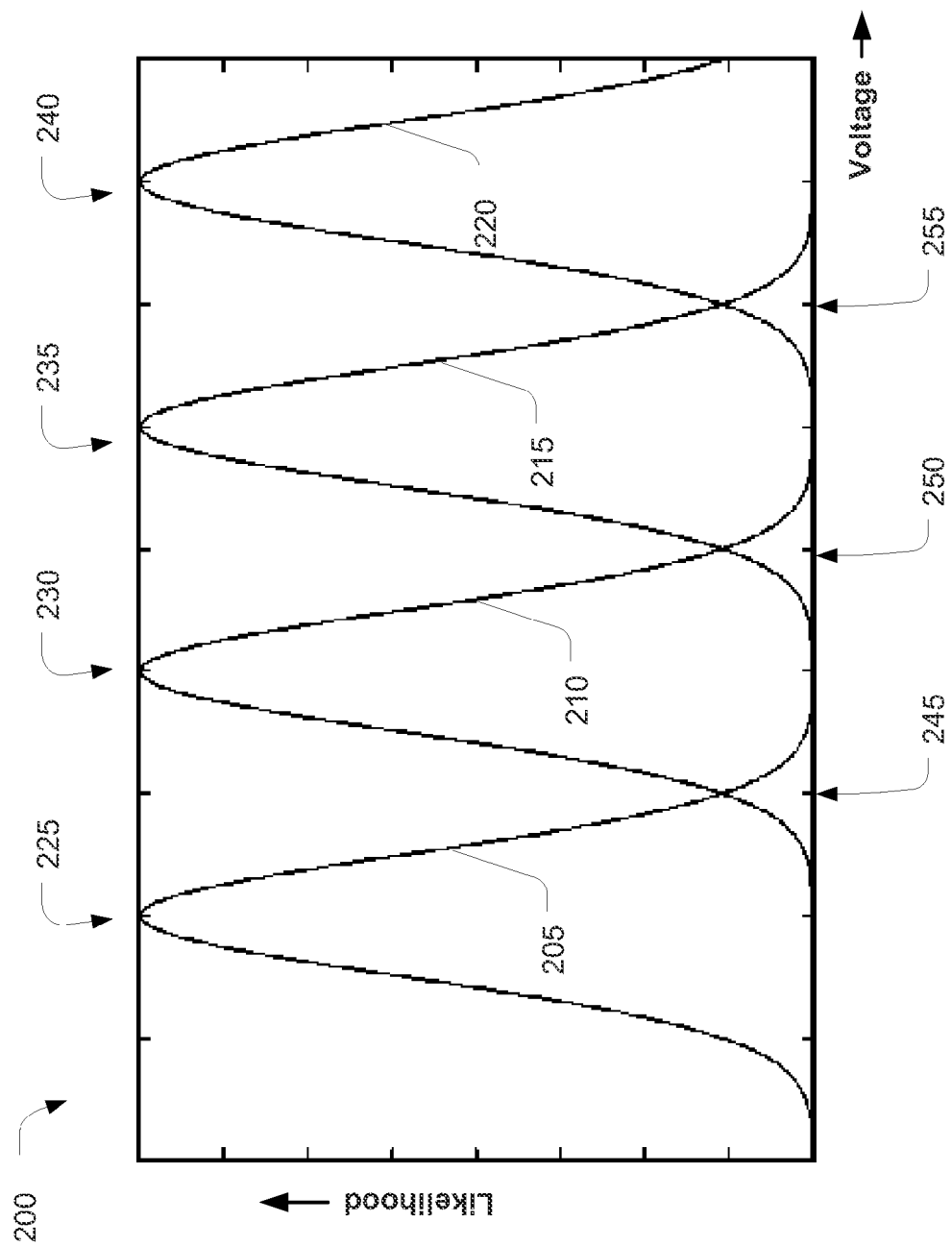
FIG. 2 illustrates exemplary probability density functions (PDFs) for a multi-bit solid state memory cell, in accordance with various embodiments.

FIG. 2 shows an example of a 2-bit NVM cell with four separate PDFs 205, 210, 215, 220 having respective peaks 225, 230, 235, 240. The magnitude of a PDF may represent the likelihood that a cell storing a value will store the value at that voltage. For example, if a cell is configured to store values of "00", "01", "10", or "11", then each value may correspond to a PDF.

In the displayed embodiment, PDF 205 may correspond to a value of "11". PDF 210 may correspond to a value of "10." PDF 215 may correspond to a value of "01". PDF 220 may correspond to a value of "00". In this example PDF 205 indicates that the cell is most likely to be storing the value "11" at the voltage indicated by peak 225. However, in some cases neighboring PDFs may overlap. For example, the cell may be storing either the value "11" or "10" at the voltage 245 where PDF 205 and PDF 210 overlap. Similarly, PDF 210 and PDF 215 may overlap at a second voltage 250, and PDF 215 and PDF 220 may overlap at a third voltage 255. It will be recognized that the above association of each PDF with a specific value is exemplary, and the values may be reassigned in any other order in other embodiments.

FIG. 3-A depicts an exemplary read of an NVM cell, in accordance with various embodiments. Although FIG. 3-A only depicts a 1-bit NVM cell, the described method of reading the value of the cell, below, may be extrapolated to any n-bit NVM cell. Specifically, FIG. 3-A depicts a first PDF 300 and a second PDF 305. In some embodiments, PDF 300 may be associated with a cell value of "1", and PDF 305 may be associated with a cell value of "0". PDFs 300 and 305 have respective peaks 310, 315 at respective first voltages and second voltages. In order to perform the SBR, the value of the cell may first be read at a center read reference voltage 320. In some embodiments, the center read reference voltage 320 may correspond to the voltage where the first PDF 300 and the second PDF 305 are equal to one another. However, in other embodiments the center read reference voltage 320 may be initially offset with respect to the first PDF 300 and the second PDF 305. For example, the center read reference voltage 320 may be offset because of intrinsic charge loss. Alternatively, the center read reference voltage 320 may be offset due to program disturb or over programming.

In an HBR, where the value of the cell may only be read a single time as described above, the value of the cell may only be read at the center read reference voltage 320 If the HBR indicates that the cell is storing a value at a voltage lower than the center read reference voltage 320, then the output of the HBR may be that the cell has a value of "1". If the HBR indicates that the cell is storing a value at a voltage higher than the center reference voltage 320, then the output of the HBR may be that the cell has a value of "0".

In a soft bit read (SBR), where the value of the cell may be read a plurality of times as described above, the value of the cell may be read at the center read reference voltage 320, at a second read reference voltage 325 and a third read reference voltage 330. The second and third read reference voltages 325, 330 may be used to provide the confidence level regarding the read of the value of the cell. In this example, if a read of the cell value at the second read reference voltage 325 indicates that the value of the cell is "1", then it may be said with a high confidence level that the value of the cell is "1". Similarly, if a read of the cell at the third reference voltage 330 indicates that the value of the cell is "0", then it may be said with a high confidence level that the value of the cell is "0". However, if the value of the cell read at the center read reference voltage 320 and the second read reference voltage 325 or the third read reference voltage 330 conflict, then the read value of the cell may have a low confidence level.

FIG. 3-B depicts an alternative graph for the exemplary read of the solid state memory cell of FIG. 3-A. Specifically, FIG. 3-B depicts CDFs 335, 340 which respectively correspond to PDFs 300, 305 of FIG. 3-A. A CDF may be considered to be the integral of a corresponding PDF. In other words, the CDF may be interpreted as showing the likelihood of a cell storing a specific value at a voltage which is less than or equal to the voltage at which the CDF is read. As an example, points 345 on CDF 335 may correspond to how many of the cells of the page of memory which have values of "1" are identified when read at reference voltages up to and including reference voltages 320, 325, and 330. Points 350 on CDF 340 may correspond to how many of the cells of the page of memory which have values of "0" are identified when read at reference voltages up to and including reference voltages 320, 325, and 330. As shown, the points 345 on CDF 335 may have a very high value because they correspond to a relatively high voltage of PDF 300. By contrast, point 350 on CDF 340 may have a very low value because they correspond to a relatively low voltage of PDF 305. However, as can be seen, CDF 340 may increase significantly as the voltage scale increases.

Figure 4:
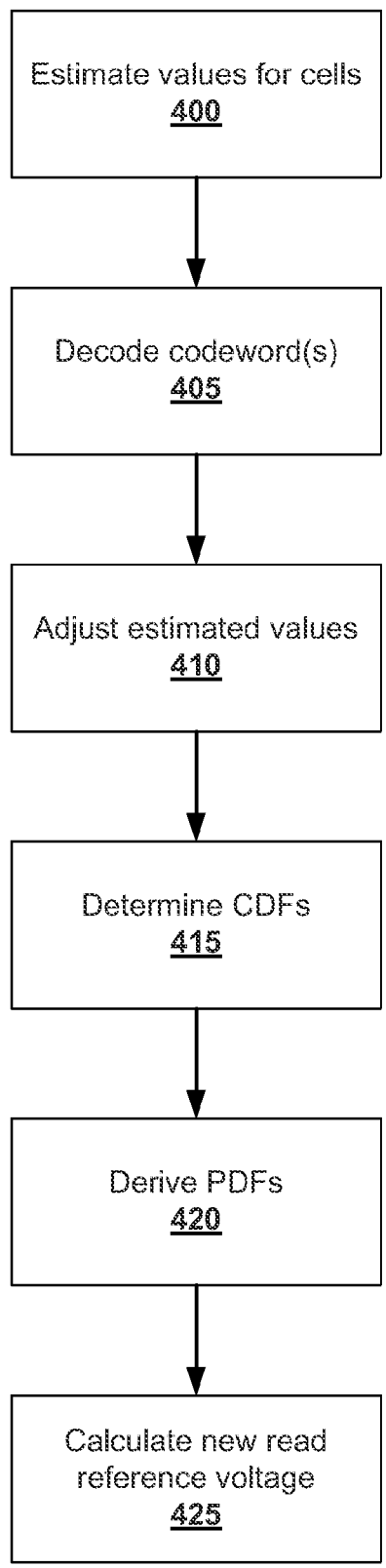
FIG. 4 illustrates an exemplary flow chart for calculating a new center read reference voltage for a multi-bit solid state memory cell, in accordance with various embodiments.

FIG. 4 depicts an exemplary method for calculating the CDFs, PDFs, and a new center read reference voltage for a page of an NVM cell. In the following description, a page of NVM cells, for example page 112 of FIG. 1, will be described.

In a first embodiment, the method will be described with respect to a SBR of the cell. Initially, the values of cells in the page may be estimated at 400. The cell values may be estimated by reading the value of the cell at an original read reference voltage and second and third read reference voltages in accordance with the SBR method described above. In some embodiments, the value of all cells in the page, or in multiple pages, may be estimated. In other embodiments, some subset of cells in the page may be used.

After estimating the values of the cells, one or more LDPC codewords may be decoded at 405. In one example, if the page of memory is 16 KB, then 16 1 KB LDPC codewords may be decoded. In some embodiments, a different decoding method such as turbo codes may be used instead of LDPC decoding.

After the LDPC codewords are decoded, the estimated values of one or more cells from the estimation at 400 may be adjusted at 410. Specifically, the estimated values of the one or more cells may be adjusted according to the output of the one or more LDPC decoded codewords. For example, the read value of a cell which has an estimated value of "1" may be adjusted to have a read value of "0". Inversely, the read value of a cell which has an estimated value of "0" may be adjusted to have a read value of "1". The adjustment may be based on whether the decoded LDPC codewords indicate that errors exist in reading the values of the cell, or on some other factor.

After the estimated values of the cells at the plurality of voltages are adjusted, then the values of the cells at the three reference voltages may be known and used to model the CDFs of the cell at 415. Specifically, the CDF values for cells that have a value of "0" and the CDF values for cells that have a value of "1" may be known at each of the 3 reference voltages. Because the CDF values for cells having a value of "0" and "1" is known at each of the three voltages, then the CDF for the value of "1" and the CDF for the value of "0" may be modeled. Specifically, the CDFs may be modeled according to the equation: $\Phi(z)=(1+e^{p(z)})^{-1}$ Equation (1) where $\Phi(z)$ represents one of the estimated first, second or third values of a CDF, and $p(z)$ represents a coefficient of an equation defining the CDF.

Equation 1 may be solvable for the CDF representing the value "1" or the CDF representing the value "0" by solving the following second-degree equation:

$$\begin{bmatrix} p_0 \\ p_1 \\ p_2 \end{bmatrix} = \begin{bmatrix} 1 & z_1 & z_1^2 \\ 1 & z_2 & z_2^2 \\ 1 & z_3 & z_3^2 \end{bmatrix}^{-1} \begin{bmatrix} \ln((1/\Phi(z_1))-1) \\ \ln((1/\Phi(z_2))-1) \\ \ln((1/\Phi(z_3))-1) \end{bmatrix} \quad \text{(Equation 2)}$$

It will be recognized that Equations 1 and 2 are merely exemplary equations corresponding to a particular embodiment. Other equations involving more or less degrees of freedom or factors may be used in other embodiments. In other embodiments, the coefficients of $p(z)$ may be calculated in Equation 2 by using z1−z2, 0, and z3−z2 in place of z1, z2, and z3, respectively.

After the CDFs corresponding to the value "1" and the value "0" are derived, then the PDFs corresponding to the values "1" and "0" may be derived from the respective CDFs at 420. As noted above, each CDF may be the integral of a respective PDF, therefore the PDFs may be derived as the derivative of a CDF. For example, the PDF corresponding to the value "1" may be calculated as the derivative of a CDF corresponding to the value "1". Additionally, the PDF corresponding to the value "0" may be calculated as the derivative of a CDF corresponding to the value "0".

After the values of the PDFs are derived, then a new center read reference voltage may be calculated from the PDFs at 425. For example, the new center read reference voltage may be the read reference voltage where the PDF for the value "0" is equal to the PDF for the value "1". Referring to FIG. 3-A, this may occur at the voltage corresponding to the depiction of the center read reference voltage 320. Where the two PDFs cross may be called a "valley" voltage. Typically, the raw bit error rate (RBER), or the number of errors divided by the total number of bits read, may be lowest at the "valley" voltage. Therefore, if the new center read reference for the page is set at the "valley" voltage, then the number of errors produced during a read of the cells in the memory page may be minimized.

In certain embodiments, the new center read reference voltage may be calculated by calculating the RBER based at least in part on the first CDF and the second CDF by the equation: RBER(x)=1−CDF1(x)+CDF0(x) (Equation 3) where RBER(x) is the value of the RBER at voltage x, CDF1(x) is the value of the first CDF at voltage x, and CDF0(x) is the value of the second CDF at voltage x. In certain embodiments, the RBER may be calculated at many different voltages, for example expanding outwardly from the original center read reference voltage to determine which voltage gives the lowest RBER according to Equation 3. It will be recognized that other equations for calculating the RBER, or other methods of calculating a lowest RBER, may be used in other embodiments.

It will be noted that an advantage of the above described method of determining a new center read reference voltage may be used even if SBRs of cells in the page are unsuccessful. This is because the LDPC codewords may have a higher probability of correcting errors in the cell reads than changing correct reads to incorrect reads.

In an alternate embodiment, a hard bit read (HBR) may be performed in place of the SBR. In this embodiment, the values of the cells may only be estimated at the original center read reference voltage at 400. After the estimated values are adjusted at 410, certain educated guesses may be made regarding whether the center read reference voltage in the "valley" of the two PDFs of the memory page.

For example, the number of cells with values of "0" or "1" that are adjusted based on the one or more decoded LDPC codewords should be roughly equal at step 410 if the center read reference voltage is at the "valley" voltage. If there is a disparity in the number of adjusted values, for example more cells with estimated values of "0" are adjusted to have values of "1" than cells with values of "1" are adjusted to have values of "0", or vice versa, then the center read reference voltage may not be at the "valley" voltage. Specifically, if the number of cells with values of "1" adjusted to cells with values of "0" during the value adjustment are less than the number of cells with values of "0" adjusted to cells with values of "1", then the center read reference voltage may be positioned at a greater voltage than is desirable due to intrinsic charge loss, and therefore the new center read reference voltage may be reduced to be less than the original center read reference voltage. Alternately, if the memory page is experiencing impairment due to both program disturb and over programming, then an overall high number of cell values may be adjusted. Program disturb in combination with single bit charge loss may be signaled if the only adjustments are cells with values of "1" being adjusted to have values of "0".

The type of impairment being experienced by the memory page may be used to determine certain information regarding the PDF or CDF of the memory page, for example the standard deviation of the CDF. Other information such as the mean of the CDF may be determined based on the number of cells with values of "0" adjusted to have values of "1", or vice versa. For example, the means of each CDF may be calculated based on averaging the total number of cell value adjustments from values of "0" to values of "1", or based on some other calculation.

Alternatively, the HBR may be performed at a number of clock cycles of the memory at 400. By performing the HBR at the multiple clock cycles, multiple estimated values of the cells may be determined at 410. The multiple estimated values may be adjusted as described above, and the adjusted values may then be used to determine the CDFs at 415 and corresponding PDFs at 420 as described above with respect to the SBR scenario.

The above described methods are discussed with respect to finding only a value of a single bit cell. However, the methods may be extrapolated to two-bit cells, or cells with any number of bits. As described earlier with reference to FIG. 2, values in the cell may be stored such that PDF 205 corresponds to a cell value of "11", PDF 210 corresponds to a cell value of "10", PDF 215 corresponds to a cell value of "01", and PDF 220 corresponds to a cell value of "00". As described earlier, the first digit in the cell value may be considered the MSB and correspond to a lower page read of the page of memory, and the last digit in the cell value may be considered the LSB and correspond to an upper page read of the page of memory.

In certain embodiments, the lower page read may be performed first, and the method described with respect to FIG. 4 may be performed to determine the values of the MSBs of the cells in the page of memory. Additionally, the new center read reference voltage for the MSB may be determined at step 425 of FIG. 4.

Figure 5:
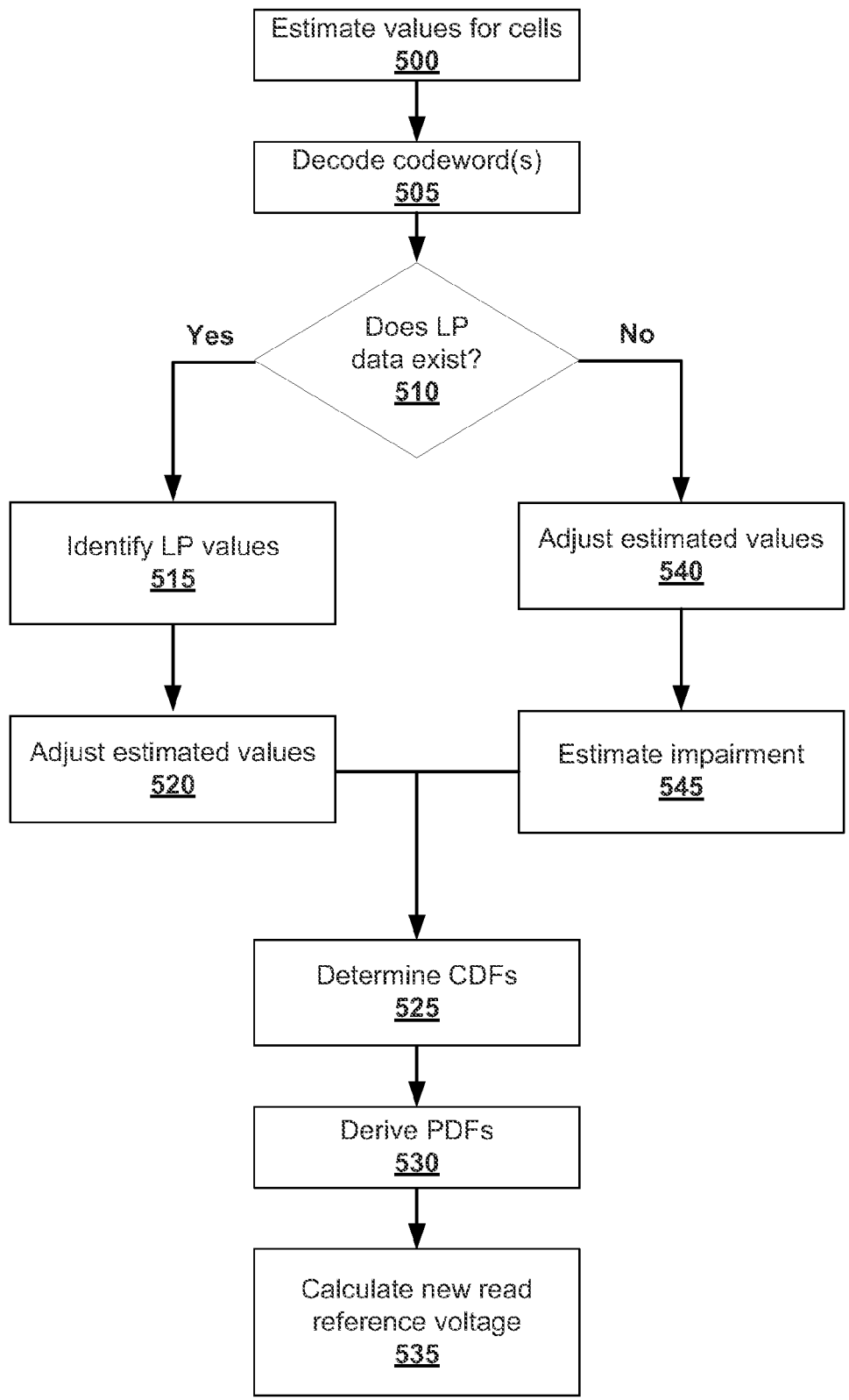
FIG. 5 illustrates another exemplary flow chart for calculating a new center read reference voltage for a multi-bit solid state memory cell, in accordance with various embodiments.

FIG. 5 depicts how an upper page read may then be performed to determine the new center read reference voltages at which to read the LSBs of the cells in the page of memory, for example at or near voltages 245 or 255 as shown in FIG. 2. Similarly to FIG. 4, the values of the LSBs of the cells in the page of memory may be estimated at 500, as described above with reference to 400. One or more LDPC codewords may then be decoded at 505, as described above with reference to 405. As described above, other codewords or error correction methods may be used to correct the values of incorrectly read cells in the page of memory.

A determination may then be made regarding whether lower page data exists at 510. If the lower page data exists, then values received from the lower page data may be identified at 515. As an example, referring to FIG. 2, a read of the values of cells in the page of memory at an original center read reference voltage at voltage 245 may identify several values that are related to PDFs 215 and 220. However, if the purpose of the read of the cell values is to identify the value of the LSBs of cells in the page of memory corresponding to PDFs 205 and 210, then the values corresponding to PDFs 215 and 220 may cause errors. If a previous lower page read is done to determine the values of the MSBs of the cells in the page of memory at a center read reference voltage at or near voltage 250, then the values corresponding to PDFs 215 and 220 may be known.

If lower page values are identified at 515, then the values produced by the lower page read may be used in conjunction with the one or more LDPC codewords produced by decoding the codewords at 505 to adjust the estimated values of the cells at 520. After the values are adjusted, then one or more CDFs may be determined at 525 and one or more PDFs may be derived from the CDFs at 530, as described above with reference to elements 415 and 420 of FIG. 4. Finally, a new center read reference voltage may be calculated for reading the LSB corresponding to PDFs 205 and 210 or PDFs 215 or 220, as described above with reference to element 425 of FIG. 4.

In certain embodiments, lower page values may not exist. In these embodiments, the estimated values of the LSBs of the cells in the page may be adjusted based on the decoded one or more codewords at 540. The number cells with values of "1" which are adjusted to have values of "0" and the number of cells with values of "0" which are adjusted to have values of "1" may be obtained by the adjustment process. As described above, the type of impairment may be estimated at 545 by analyzing how many cell values of "1" are adjusted to values of "0" and vice versa. For example, one may be able to estimate whether the memory page is experiencing impairment due to intrinsic charge loss, over programming, program disturb, single bit charge loss, or some combination of impairments. As described above, the impairment may be used to determine the CDFs for the memory page at 525. The PDFs may then be derived at 530 and new center read reference voltages for reading the values of the LSBs of the multi-bit memory cells may be calculated at 535.

It will be recognized with respect to FIGS. 4 and 5 that multiple codewords may be decoded in some embodiments. In certain of these embodiments, the values of the memory cells that are used for the estimation at 400 or 500, may be dependent on whether the codewords are successfully decoded, for example at 405 or 505. As an example, assume that the page of memory is storing 16 1 KB codewords. If only 6 of those codewords are decoded correctly, then only the memory cells in the page related to those 6 codewords may be used in the methods described in FIG. 4 or 5. In other embodiments, the values of a greater or lesser number of cells may be used, and those values may be selected based on other criteria.

Figure 6:
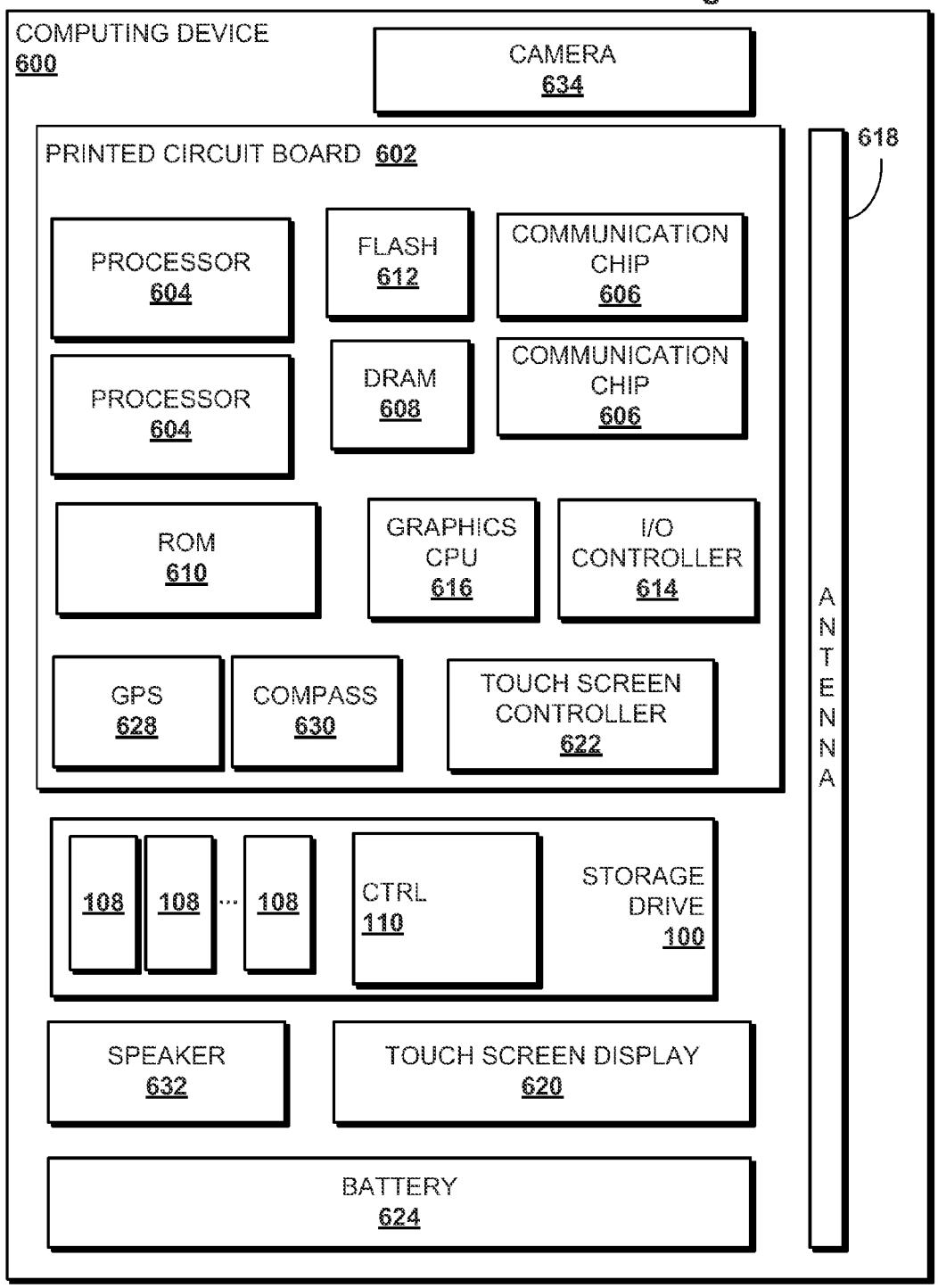
FIG. 6 illustrates an exemplary system configured to perform the methods described herein, in accordance with various embodiments.

FIG. 6 illustrates an example computing device 600 in which systems such as storage drive 100 may be incorporated, in accordance with various embodiments. Computing device 600 may include a number of components, one or more processor(s) 604 and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include PCB 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, volatile memory (e.g., DRAM 608), non-volatile memory such as read only memory 610 ("ROM") and storage drive 100 (which may include die 108 and controller 110 as described earlier), an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system ("GPS") device 628, a compass 630, an accelerometer (not shown), a gyroscope (not shown), a speaker 632, a camera 634, and a mass storage device (such as hard disk drive, a solid state drive, compact disk ("CD"), digital versatile disk ("DVD")) (not shown), and so forth. In various embodiments, the processor 604 may be integrated on the same die with other components to form a System on Chip ("SoC").

In various embodiments, rather than or in addition to storage drive 100, computing device 600 may include resident non-volatile memory, e.g., flash memory 612. In some embodiments, the one or more processor(s) 604 and/or flash 612 may include associated firmware (not shown) storing programming instructions configured to enable computing device 600, in response to execution of the programming instructions by one or more processor(s) 604 to practice all or selected aspects of the blocks described above with respect to FIG. 4 or 5. In various embodiments, these aspects may additionally or alternatively be implemented using hardware separate from the one or more processor(s) 604 or flash memory 612.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("HSUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 600 may be any other electronic device that processes data.

Embodiments of methods, instructions, systems and apparatuses are provided herein for center read reference voltage determination based on an estimated PDF. In some embodiments, first and second CDFs may be estimated for a page of memory. The page of memory may comprise one or more multi-bit memory cells, each of the memory cells having a respective value. The first and second CDFs may represent the values of the multi-bit memory cells, and the estimating may be based at least in part on a decoder output of a codeword of the page. First and second PDFs may then be estimated, respectively based at least in part on the first and second CDFs, and then a center read reference voltage may be determined for reading a multi-bit memory cell in the page. The center read reference voltage may be determined based at least in part on the first and second PDFs.

In certain embodiments, the values of the plurality of multi-bit memory cells may be encoded according to an LDPC encoding format, and likewise decoded according to an LDPC decoding process to produce the decoder output. In some other embodiments, the value of each multi-bit memory cell may be estimated at a plurality of voltages to produce a plurality of estimated values. The plurality of estimated values may be adjusted based at least in part on the decoder output. First, second and third values of each of the first and second CDFs may be estimated based at least in part on the adjusted values. In certain embodiments, the first CDF may be based on the equation $\Phi(z)=(1+e^{p(z)})^{-1}$ where $\Phi(z)$ represents one of the estimated first, second or third values of the first CDF, and p(z) represents a coefficient of an equation defining the first CDF, and the first PDF may be based at least in part on a derivative of the first CDF.

In some embodiments the value of each multi-bit memory cell may be estimated at a plurality of estimation cycles to produce a plurality of estimated values. The estimated values may be adjusted based at least in part on the decoder output, and first, second and third values of the first and second CDFs may be estimated based at least in part on the adjusted values. In certain embodiments the values of the multi-bit memory cells in the page may be an MSB of the multi-bit memory cells corresponding to a lower page read of the page. In other embodiments the values of the multi-bit memory cells may be an LSB of the multi-bit memory cells corresponding to an upper page read of the page. Further, the first and second CDFs may be estimated based at least in part on values related to values of the MSB of each of the multi-bit memory cells. In some embodiments, the center read reference voltage may comprise a voltage where the first PDF is equal to the second PDF.

In some embodiments, the multi-bit memory cells may be cells of NVM. Certain embodiments may contain instructions configured to cause an apparatus, in response to execution of the instructions by the apparatus, to perform one or more of the actions described above. Alternative embodiments may include an apparatus configured to perform one or more of the actions described above. Alternatively, embodiments may include a system comprising a writer configured to write a value of a bit to a solid state multi-bit memory cell in a page, each memory cell having a value. The system may further include a reader configured to read the value of the bit from the solid state memory cell. The system may also include a decoder coupled with the reader and configured to decode a codeword of the page to produce a decoder output. Finally, the system may include a controller coupled with the reader and writer and configured to estimate first and second CDFs for the values of the memory cells based at least in part on the decoder output, estimate first and second PDFs respectively based on the first and second CDFs, and determine a center read reference voltage for reading the memory based at least in part on the first and second PDFs. The system, or elements of the system, may be further configured to perform one or more of the actions described above.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A method comprising:
   estimating respective first and second cumulative density functions for a page of memory comprising a plurality of multi-bit memory cells each having a respective value, the first and second cumulative density functions representing the values of the multi-bit memory cells in the page, and the estimating based at least in part on a decoder output of a codeword of the page;
   estimating a first and a second probability density function for the page, based respectively at least in part on the first and second cumulative density functions; and
   determining a center read reference voltage for reading a multi-bit memory cell in the page, based at least in part on the first and second probability density functions.

2. The method of claim 1, wherein the values of the plurality of the multi-bit memory cells are encoded according to a low density parity check (LDPC) encoding format; and
the values of the multi-bit memory cells in the page are decoded according to an LDPC decoding process to produce the decoder output.

3. The method of claim 1, further comprising:
estimating the value of each multi-bit memory cell in the page at a plurality of voltages to produce a plurality of estimated values;
adjusting at least one of the plurality of estimated values based at least in part on the decoder output to produce adjusted values; and
estimating respective first, second and third values of each of the first and second cumulative distribution functions based at least in part on the adjusted values to produce estimated first, second and third values of the first cumulative distribution function and estimated first, second and third values of the second cumulative distribution function.

4. The method of claim 3, wherein the first cumulative distribution function is based on the equation $\Phi(z)=(1+e^{p(z)})^{-1}$ where $\Phi(z)$ represents one of the estimated first, second or third values of the first cumulative distribution function, and $p(z)$ represents a coefficient of an equation defining the first cumulative distribution function.

5. The method of claim 4, wherein the first probability function is based at least in part on a derivative of the first cumulative distribution function.

6. The method of claim 1, further comprising:
estimating a value of each multi-bit memory cell in the page at a plurality of estimation cycles to produce a plurality of estimated values;
adjusting at least one of the plurality of estimated values based at least in part on the decoder output to produce adjusted values;
estimating respective first, second and third values of each of the first and second cumulative distribution functions based at least in part on the adjusted values.

7. The method of claim 1, wherein the values of the multi-bit memory cells in the page are a most significant bit of the multi-bit memory cells corresponding to a lower page read of the page.

8. The method of claim 1, wherein the values of the multi-bit memory cells are a least significant bit of the multi-bit memory cells corresponding to an upper page read of the page.

9. The method of claim 8, further comprising estimating the first and second cumulative distribution functions based at least in part on values related to values of a most significant bit of each of the multi-bit memory cells corresponding to a lower page read of the page.

10. The method of claim 1 wherein the center read reference voltage comprises a voltage where the first probability density function is equal to the second probability density function.

11. A computer readable media comprising instructions configured to cause an apparatus, in response to execution of the instructions by the apparatus, to:
estimate, respectively, a first and a second cumulative density function for respective values of a plurality of multi-bit non-volatile memory (NVM) cells based at least in part on one or more decoder outputs for one or more codewords for data stored in the plurality of NVM cells;
estimate a first and a second probability density function for the values of the plurality of NVM cells, based respectively at least in part on the first and second cumulative density functions; and
determine a center read reference voltage for reading an NVM cell based at least in part on the first and second probability density functions.

12. The computer readable media of claim 11, wherein the instructions cause the apparatus, in response to execution of the instructions by the apparatus, to:
estimate the value a plurality of NVM at a plurality of voltages to produce a plurality of estimated values;
adjust at least one of the plurality of estimated values based at least in part on the one or more decoder outputs to produce adjusted values;
estimate respective first, second and third values of each of the first and second cumulative distribution functions based at least in part on the adjusted values; and
estimate the first cumulative distribution function based at least in part on the estimated first, second and third values of the first cumulative distribution function, and estimate the second cumulative distribution function based at least in part on the estimated first, second and third values of the second cumulative distribution function.

13. The computer readable media of claim 11, wherein the instructions cause the apparatus, in response to execution of the instructions by the apparatus, to:
estimate the value of a plurality of NVM cells at a plurality of estimation cycles to produce a plurality of estimated values;
adjust at least one of the plurality of estimated values based at least in part on the one or more decoder outputs to produce adjusted values;
estimate respective first, second and third values of each of the first and second cumulative distribution functions based at least in part on the adjusted values.

14. The computer readable media of claim 11, wherein the values of the NVM cells are a least significant bit of the NVM cells corresponding to an upper page read of the page; and
wherein the instructions cause the apparatus, in response to execution of the instructions by the apparatus, to estimate the first and second cumulative distribution functions based at least in part on a plurality of values related to a most significant bit of the NVM cells corresponding to a lower page read of the page.

15. An apparatus configured to:
estimate respective first and second cumulative density functions for a page of memory comprising a plurality of multi-bit memory cells each having a respective value, the first and second cumulative density functions representing the values of the multi-bit memory cells in the page, and the estimating based at least in part on a decoder output of a codeword of the page;
estimate a first and a second probability density function for the page, based respectively at least in part on the first and second cumulative density functions; and
determine a center read reference voltage for reading a multi-bit memory cell in the page, based at least in part on the first and second probability density functions.

16. The apparatus of claim 15, wherein the values of the plurality of the multi-bit memory cells are encoded according to a low density parity check (LDPC) encoding format; and
the values of the multi-bit memory cells in the page are decoded according to an LDPC decoding process to produce the decoder output.

17. The apparatus of claim 15, further configured to:
- estimate the value of each multi-bit memory cell in the page at a plurality of voltages to produce a plurality of estimated values;
- adjust at least one of the plurality of estimated values based at least in part on the decoder output to produce adjusted values; and
- estimate respective first, second and third values of each of the first and second cumulative distribution functions based at least in part on the adjusted values to produce estimated first, second and third values of the first cumulative distribution function and estimated first, second and third values of the second cumulative distribution function.

18. The apparatus of claim 15, further configured to:
- estimate a value of each multi-bit memory cell in the page at a plurality of estimation cycles to produce a plurality of estimated values;
- adjust at least one of the plurality of estimated values based at least in part on the decoder output to produce adjusted values; and
- estimate respective first, second and third values of each of the first and second cumulative distribution functions based at least in part on the adjusted values.

19. A system comprising:
- a writer configured to write a value of a bit to a solid state multi-bit memory cell in a page comprising a plurality of solid state multi-bit memory cells, each solid state multi-bit memory cell in the page configured to have a value;
- a reader configured to read the value of the bit from the solid state memory cell;
- a decoder coupled with the reader and configured to decode a codeword of the page to produce a decoder output; and
- a controller coupled with the reader and writer, and configured to:
  - estimate, respectively, a first and a second cumulative density function for the values of the multi-bit solid state memory cells based at least in part on the decoder output;
  - estimate a first and a second probability density function for the values of the multi-bit solid state memory cells, based respectively at least in part on the first and second cumulative density functions; and
  - determine a center read reference voltage for reading the multi-bit solid state memory cell in the page, based at least in part on the first and second probability density functions.

20. The system of claim 19, wherein the controller is further configured to:
- cause the reader to read the value of each multi-bit cell in the page at a plurality of voltages to produce a plurality of estimated values;
- adjust at least one of the plurality of estimated values based at least in part on the decoder output to produce adjusted values;
- estimate respective first, second and third values of each of the first and second cumulative distribution functions based at least in part on the adjusted values; and
- estimate the first cumulative distribution function based at least in part on the estimated first, second and third values of the first cumulative distribution function, and estimate the second cumulative distribution function based at least in part on the estimated first, second and third values of the second cumulative distribution function.

21. The system of claim 19, wherein the controller is further configured to:
- cause the reader to read the value of each multi-bit cell in the page at a plurality of estimation cycles to produce a plurality of estimated values;
- adjust at least one of the plurality of estimated values based at least in part on the decoder output to produce adjusted values;
- estimate respective first, second and third values of each of the first and second cumulative distribution functions based at least in part on the adjusted values.

22. The system of claim 19, wherein the values of the multi-bit solid state memory cells are a most significant bit of the multi-bit solid state memory cells corresponding to a lower page read of the page.

23. The system of claim 19, wherein the values of the multi-bit solid state memory cells are a least significant bit of the multi-bit solid state memory cells corresponding to an upper page read of the page.

24. The system of claim 23, wherein the controller is further configured to estimate the first and second cumulative distribution functions based at least in part on values related to respective most significant bits of the solid state memory cells corresponding to a lower page read of the page; and
- wherein the center read reference voltage is a voltage where the reader reads the values of the plurality of multi-bit solid state memory cells with a low raw bit error rate.

* * * * *

UNITED STATES PATENT AND TRADEMARK OFFICE
CERTIFICATE OF CORRECTION

| | | |
|---|---|---|
| PATENT NO. | : 8,804,421 B2 | Page 1 of 1 |
| APPLICATION NO. | : 13/664807 | |
| DATED | : August 12, 2014 | |
| INVENTOR(S) | : Ravi H. Motwani | |

It is certified that error appears in the above-identified patent and that said Letters Patent is hereby corrected as shown below:

On the Title Page

Item (71) Applicant: "Ravi H. Motwani" should read --Intel Corporation--.

In the Claims

Claim 12, column 14
Line 9, "estimate the value a plurality" should read --estimate the value of a plurality--.

Signed and Sealed this
Twenty-third Day of June, 2015

Michelle K. Lee
*Director of the United States Patent and Trademark Office*